United States Patent [19]
Dodd

[11] Patent Number: 6,157,042
[45] Date of Patent: Dec. 5, 2000

[54] OPTICAL CAVITY ENHANCEMENT INFRARED PHOTODETECTOR

[75] Inventor: Mark A. Dodd, Arlington, Tex.

[73] Assignee: Lockheed Martin Corporation, Bethesda, Md.

[21] Appl. No.: 09/185,249

[22] Filed: Nov. 3, 1998

[51] Int. Cl.[7] .............................. H01L 29/78; H01L 33/00
[52] U.S. Cl. .............................. 257/21; 257/436; 257/437
[58] Field of Search ...................................... 257/436, 437, 257/21

[56] References Cited

U.S. PATENT DOCUMENTS

| | | | |
|---|---|---|---|
| 3,799,653 | 3/1974 | Ikeda ........................................ | 350/164 |
| 4,578,527 | 3/1986 | Rancourt et al. ........................ | 136/256 |
| 4,783,594 | 11/1988 | Schulte et al. ...................... | 250/370.08 |
| 4,936,653 | 6/1990 | Schemmel et al. ...................... | 350/164 |
| 5,243,458 | 9/1993 | Hatano .................................... | 359/359 |
| 5,261,970 | 11/1993 | Landis et al. ........................... | 136/259 |
| 5,479,032 | 12/1995 | Forrest et al. .......................... | 257/190 |
| 5,539,206 | 7/1996 | Schimert .............................. | 250/338.4 |
| 5,777,390 | 7/1998 | Berger et al. ........................... | 257/749 |

FOREIGN PATENT DOCUMENTS 64-13767   1/1989   Japan .

Primary Examiner—John Guay
Attorney, Agent, or Firm—Sidley & Austin; Stephen S. Sadacca

[57] ABSTRACT

An infrared detector array includes a plurality of detector pixel structures, each of which comprises a plurality of elongate quantum well infrared radiation absorbing photoconductor (QWIP) elements. The group of QWIP elements are spaced such that they comprise a diffraction grating for the received infrared radiation. Top and bottom longitudinal contacts are provided on opposite surfaces of the QWIP elongate elements to provide current flow transverse to the axis of the element to provide the required bias voltage. An optical cavity enhancement coating applied to the surface of the elements. The coating can be applied as to fill the space between the elements and extends above the top of the array if desired. The coating may be applied in multiple layers. An infrared radiation reflector is provided to form an optical cavity for receiving infrared radiation. A plurality of detector pixel structures are combined to form a focal plane array. Each detector pixel structure produces a signal that is transmitted through a conductive bump to a terminal of a read out integrated circuit. The group of the signals from the detector pixel structures produces an image corresponding to the received infrared radiation.

41 Claims, 7 Drawing Sheets

OPTICAL CAVITY ENHANCEMENT INFRARED PHOTODETECTOR

BACKGROUND OF THE INVENTION

In the field of infrared imaging, the current objectives are to provide technology for large area focal plane arrays for long wave infrared radiation (LWIR), multispectral applications, and to provide this technology at low cost with high performance. Substantial performance has been shown by second generation photovoltaic (PV) mercury cadmium telluride (MCT) diode technology. Although MCT technology has desirable performance, it has substantial drawbacks in terms of manufacturability and uniformity. A newer, high impedance photoconductive (PC) detector technology for infrared detection termed quantum well infrared photodetector (QWIP), is based on the Gallium Arsenide (GaAs)/Aluminum Gallium Arsenide (AlGaAs) material system. This technology has significant producability and uniformity advantages over second generation PV MCT technology. This is primarily because it is based on mature GaAs/AlGaAs material and processing technology. However, QWIP technology suffers from a performance disadvantage in comparison to second generation PV MCT technology. A primary performance problem with QWIP technology is the requirement for a substantially higher bias voltage for operation which results in the production of a large dark current. The large dark current lowers the sensitivity (D*) of the detector. The excessively large dark current also severely limits the sensitivity of the detector when used within a focal plane array (FPA). Another performance problem with QWIP technology is reduced quantum efficiency relative to PV MCT technology.

In view of the desirable manufacturing qualities of QWIP, there exists a need to improve the performance characteristics of QWIP infrared detectors in the efficiency of the collection of infrared energy and in the reduction of signal noise and for improved tuning of such detectors. The present invention has the advantages of increased signal output and decreased noise.

SUMMARY OF THE INVENTION

A selected embodiment of the present invention is a quantum well infrared radiation photodetector which includes a plurality of elongate, multiple quantum well infrared radiation absorbing elements, each of which has a first and a second opposite longitudinal surface. The configuration of multiple quantum well elements comprises a diffraction grating for the infrared radiation. A first contact includes a plurality of planar, electrically connected strips which are respectively in contact with and extending along the first surfaces of the multiple quantum well elements. A second contact is electrically connected to the second surfaces of the multiple quantum well elements. The first contact and the second contact are positioned on opposite longitudinal sides of each of the multiple quantum well elements to provide current flow through the elements in a direction substantially transverse to the axis of the elements. A planar reflector for said infrared radiation is included. The reflector is positioned on an opposite side of the second contact from the multiple quantum well elements. An optical cavity enhancement coating is applied to the surfaces of photodetector between the wells. In the preferred embodiment the optical cavity enhancement coating completely fills the space between the elongate quantum well elements and has a planar surface perpendicular to the axis of the surface of the quantum wells. Preferably an optical cavity enhancement coating which completely fills the voids between the elements has an index of refraction of 1.5 or less. As used herein, refractive index means the refractive index of the material to the wavelength the detector is designed to receive.

In further aspects of the present invention, the second contact has either a planar configuration or it comprises a plurality of electrically interconnected strips in contact with and extending along the second surfaces of the multiple quantum well elements. In yet a further aspect of the invention, the optical cavity enhancement coating completely fills the space between the quantum well elements and extends above the first contact and forms a planar top surface over the detector. Optical cavity enhancement coatings which do not completely fill the space between the walls should have a refractive index of 2.5 or less and preferably 2.0 or less.

The present invention in another embodiment includes a detector having an applied optical cavity enhancement coating which has a planar surface and the application of an anti-reflective coating over the optical cavity enhancement coating.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION

Designs for QWIPs are presented in "Quantum-Well Infrared Photodetectors," J. Appl. Phys. 74 (8), Oct. 15, 1993, by B. F. Levine. Detector structures with metal gratings are shown in Figure 142 of this article. These are shown in FIGS. 1 and 2 herein.

Figure 1:
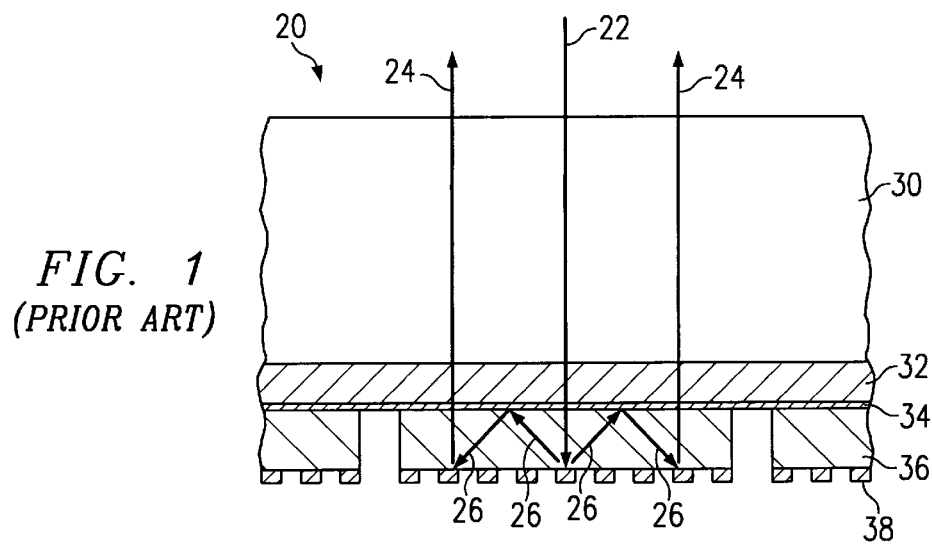
FIG. 1 is a section, elevation view of a prior art QWIP having a metal surface relief diffraction grating and GaAs substrate.

Referring to FIG. 1, a QWIP 20 receives incident mode infrared radiation as indicated by arrow 22. Reflected zero order diffractive mode radiation is indicated by arrows 24. Trapped higher order diffractive mode radiation is indicated by arrows 26. The QWIP 20 includes a GaAs substrate 30 which is joined to an AlAs reflector 32. An n$^+$GaAs contact 34 is joined to the reflector 32 and to an MQW region 36 comprising a group of layers. A metal diffractive grating 38 is joined to the MQW region. Because of quantum mechanical selection rules an MQW only absorbs radiation through modes in which a component of the electric field is perpendicular to the MQW layers in the MQW region 36. The purpose of the grating 38 is to increase the absorption of radiation by diffracting that radiation, as indicated by arrow 22, by the grating 38 to produce trapped diffracted radiation modes shown by the arrows 26 with an electric field component perpendicular to the MQW region. The arrows 26 represent trapped radiation. Only the radiation reflected normal to the surface of the QWIP 20, as shown by arrows 24, is lost by the QWIP 20. Thus, the addition of the metal grating 38 increases the absorption of infrared radiation by the QWIP 20.

Figure 2:
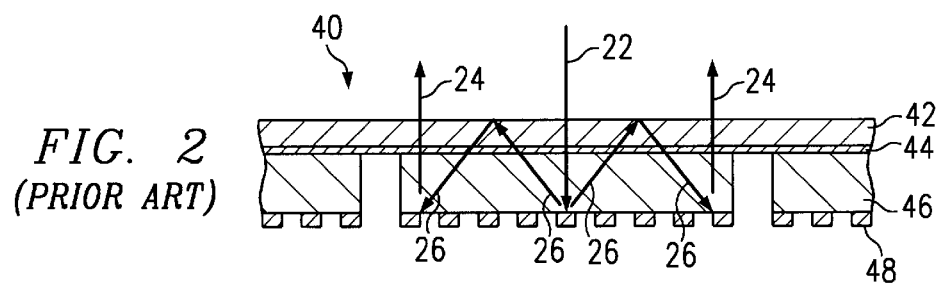
FIG. 2 is a prior art QWIP having a metal surface relief diffraction grating.

A further prior art QWIP configuration is shown in FIG. 2. A QWIP 40, similar to that shown in FIG. 1, has incident mode radiation indicated by arrow 22, reflected zero order diffractive mode radiation indicated by arrows 24 and trapped higher order diffractive mode radiation indicated by arrows 26. The QWIP 40 includes a thin GaAs substrate 42, an n$^+$ contact 44, MQW region 46 and a metal grating 48.

For LWIR applications, QWIPs 36 and 46 shown in FIGS. 1 and 2 each comprise approximately a 50 period GaAs/Al$_x$Ga$_{1-x}$As MQW with 40–50 Å GaAs wells doped n-type with a doping density of $N_D \sim (0.7-1.5) \times 10^{18}$ cm$^{-3}$, and 300–500 Å undoped Al$_x$Ga$_{1-x}$As barrier. The Aluminum to Gallium alloy ratio, x, is typically 0.26–0.29 for LWIR application. The MQW region 36 and 46 includes an MQW sandwiched between two highly doped n-type ($N_D \sim 2 \times 10^{18}$ cm$^{-3}$) n$^+$GaAs contact layers with typical thicknesses of 0.5–1 µm. The QWIP structure is epitaxially grown on a lattice matched GaAs substrate.

Figure 3A:
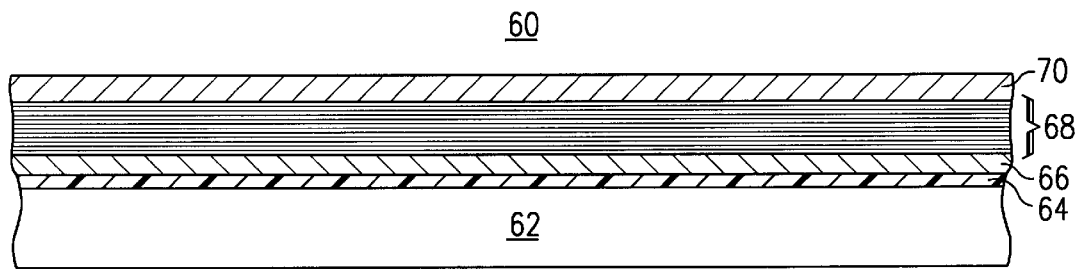
FIGS. 3A, 3B, 3C and 3D are section, elevation views illustrating a sequence of fabrication steps for producing a selected embodiment of an enhanced QWIP (EQWIPs)

A sequence of processing steps for fabricating an enhanced QWIP (EQWIP) detector without the antireflective coating is shown in FIGS. 3A, 3B, 3C and 3D. Referring to FIG. 3A, a detector 60 is fabricated on a GaAs substrate 62 with a thickness of approximately 635 µm. An Al$_6$Ga$_4$As etch stop layer 64 is formed on the surface of the substrate 62. The layer 64 has a preferable thickness of 1,000 Å.

A conductive n$^+$GaAs contact 66 is formed on the etch stop layer 64. The contact 66 has a preferable thickness of 0.5 µm. A multiple quantum well (MQW) structure 68 is formed over the contact 66. Structure 68 comprises a plurality of material layers which make up the MQW. The detailed characteristics of structure 68 are shown in Table I below. An n$^+$GaAs contact 70 is formed on the upper surface of the structure 68. Contact 70 has a preferred thickness of 0.4 µm.

The doping for contacts 66 and 70 is shown in Table I.

Figure 3B:
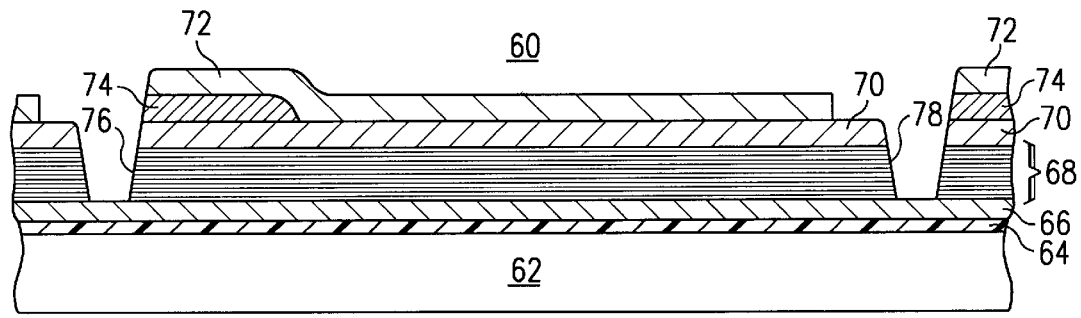

Referring to FIG. 3B, openings 76 and 78 are formed by etching through the contact 70 and MQW structure 68.

Referring to FIG. 3B, the detector 60 has an etched, planar Au/Ge ohmic contact 74 formed on the surface of the contact 70. An Au contact/reflector 72, which is a reflector for infrared radiation, is formed on the surface of contact 70 and contact 74.

Figure 3C:
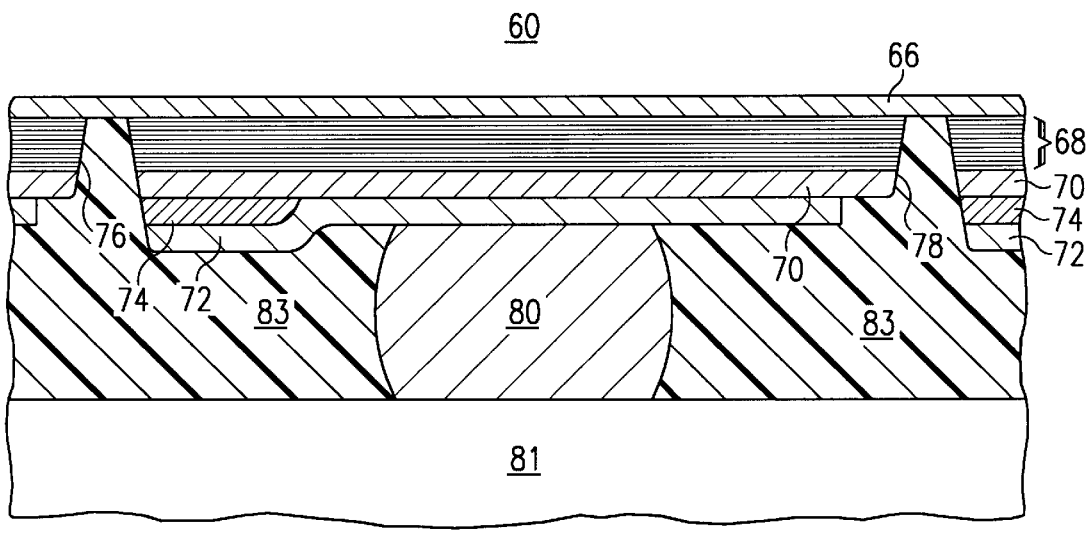

Referring to FIG. 3C, an In (indium) bump 80 is bonded to the reflector 72 and to a contact terminal (not shown) of a silicon readout integrated circuit (ROIC) 81. The bump 80 is formed by a photoresist image reversal process followed by In layer deposition and liftoff. A wicked epoxy 83 provides a physical bond between the ROIC 81, the bump 80 and the remaining exposed structure of the detector 60.

A representative direct injection ROIC structure for use with the present invention is described in "The Infrared & Electro-Optical Systems Handbook," Volume 3, Electro-Optical Components, William D. Rogatto, Editor, Chapter 5, "Readout Electronics for Infrared Sensors," John L. Vampole, ERIM/SPIE, 1993 (see section 5.6.6).

Further processing of the detector 60 is shown in FIG. 3C. The structure shown in FIG. 3C is inverted from that shown in FIG. 3B. The bulk of the substrate 62 is removed by lapping and the remainder is removed by etching down to the etch stop layer 64. The etch stop layer 64 itself is then removed. Contact 66 is thinned from 0.5 µm to 0.4 µm.

Figure 3D:
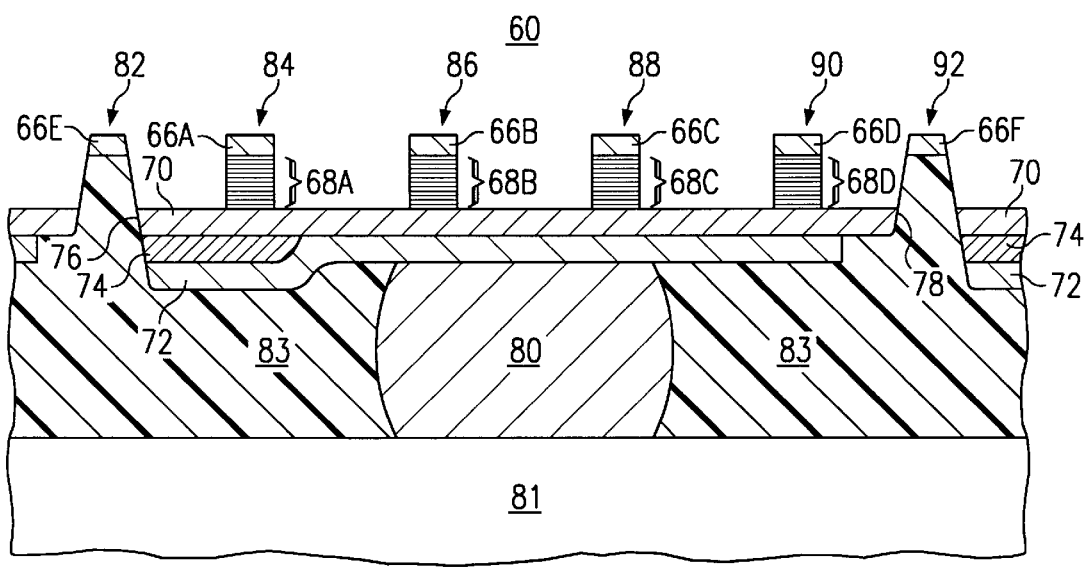

Referring to FIG. 3D, a conventional resist mask is applied to the surface of the contact 66 and an etch operation is performed. The etch extends through the contact 66, the MQW structure 68, and down to the contact 70. This produces elongate structures 82, 84, 86, 88, 90 and 92. Elongate structure 84 comprises a contact 66A over an elongate MQW element 68A. In a similar fashion, elongate structure 86 comprises a contact 66B which is in physical and electrical contact with an elongate MQW element 68B, structure 88 comprises a contact 66C over an MQW element 68C and structure 90 comprises a contact 66D over an MQW element 68D. The elements 84, 86, 88 and 90 are spaced in such a manner as to form a diffraction grating for the infrared radiation to be received by the detector 60. This produces a void or air space between the elements 84, 86, 88, 90 and an air space or void between elements 84 and 82 and between element 90 and structure 92. The optical cavity enhancement coating will be placed in these voids so as to partially or completely fill the voids. The MQW elements 68A–D are each infrared radiation absorbers.

The etching process shown in FIG. 3D also produces structures 82 and 92. The structure 82 comprises an n$^+$GaAs conductor 66E above a region of the epoxy 83. The structure 92 comprises an n$^+$GaAs conductor 66F which is supported by a region of the epoxy 83.

Figure 4A:
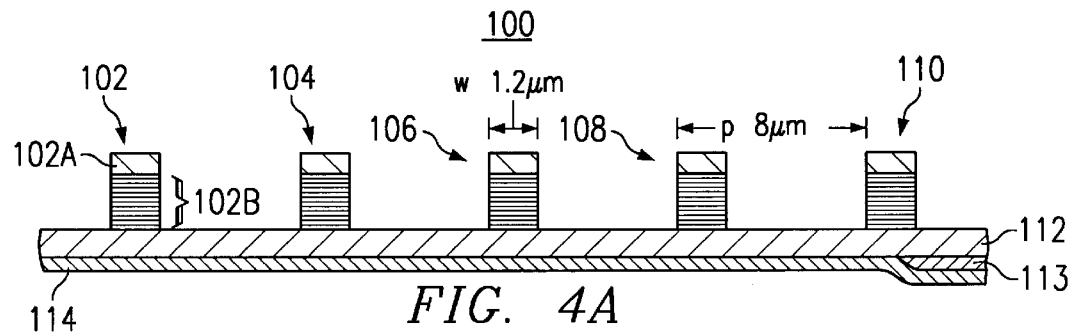
FIGS. 4A, 4B and 4C are section, elevation views showing multiple embodiments of an enhanced QWIP (EQWIPs) each consisting of a group of multiple quantum well elements forming a diffraction grating for infrared radiation.

Referring to FIG. 4A, there is shown a dimensioned layout for a detector 100. This represents one pixel element within an array of such elements. The detector 100 includes elements 102, 104, 106, 108 and 110 which are formed in the same manner as the elements 84, 86, 88 and 90 shown in FIG. 3D. Each of the elements includes a top elongate n$^+$GaAs contact, such 102A, an elongate MQW element 102B and a flat planar n$^+$GaAs contact 112 which is connected to the bottom surface of MQW elements for each of the elements 102–110. A metal contact/reflector 114 made of Au and having a thickness of 2,000 Å is formed on the opposite side of the contact 112 from the MQW elements such as 102B. Each of the elements 102–110 has a width of 1.2 microns and the elements are spaced at a pitch of 8 microns. This physical configuration is tuned for optimum response to LWIR radiation, which is in the 8–10 micron range. The space between elements is approximately 6.8 microns.

An ohmic contact 113 is a rectangular, planar structure comprising Au/Ge and having a thickness of approximately 900 Å and dimensions of 5 µm by 10 µm. The ohmic contact 113 is fabricated on the surface of contact 112 before the formation of reflector 114. The ohmic contact 113 provides a good ohmic connection between the contact 112 and the reflector 114.

Figure 4B:
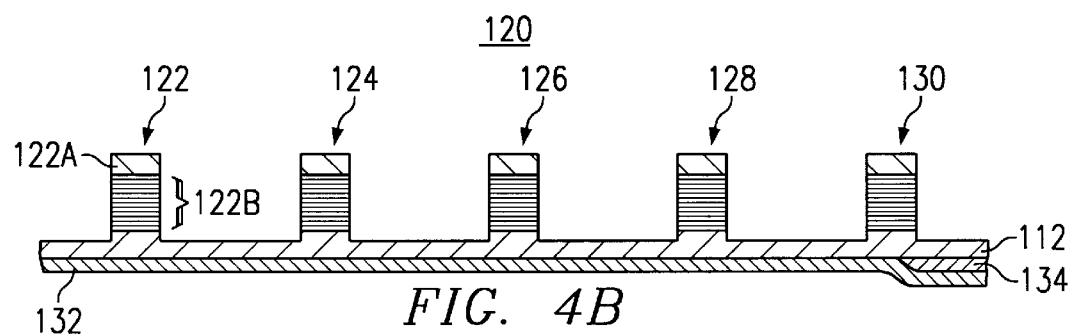

A further embodiment of a detector 120 is shown in FIG. 4B. This is essentially the same as the detector 100 shown in FIG. 4A, but the etching operation which formed the elements 102–110, is continued until the etching extends through a portion of the lower contact 112, but not the entire thickness of the contact 112. This etching operation produces elements 122, 124, 126, 128 and 130. The width and spacing of these elements is the same as the width and spacing of the elements 102–110 shown in FIG. 4A. Again, the elements are spaced apart creating air space or voids between the elements. These voids will contact/reflector 137 is then formed. The ohmic contact 143 provides a good ohmic connection between the region 112A, which is connected electrically to all of the other lower contacts, such as 138C, and the reflector 137.

Figure 4C:
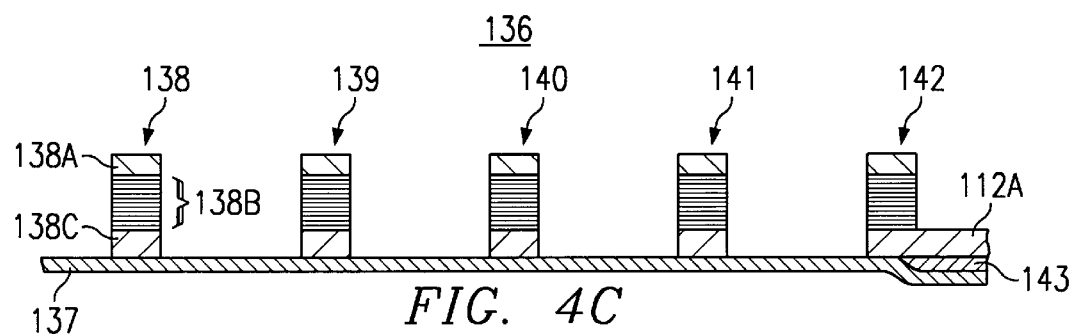

FIGS. 4A, 4B and 4C represent section views of the elongate elements 102–110, 122–130 and 138–142.

Figure 5:
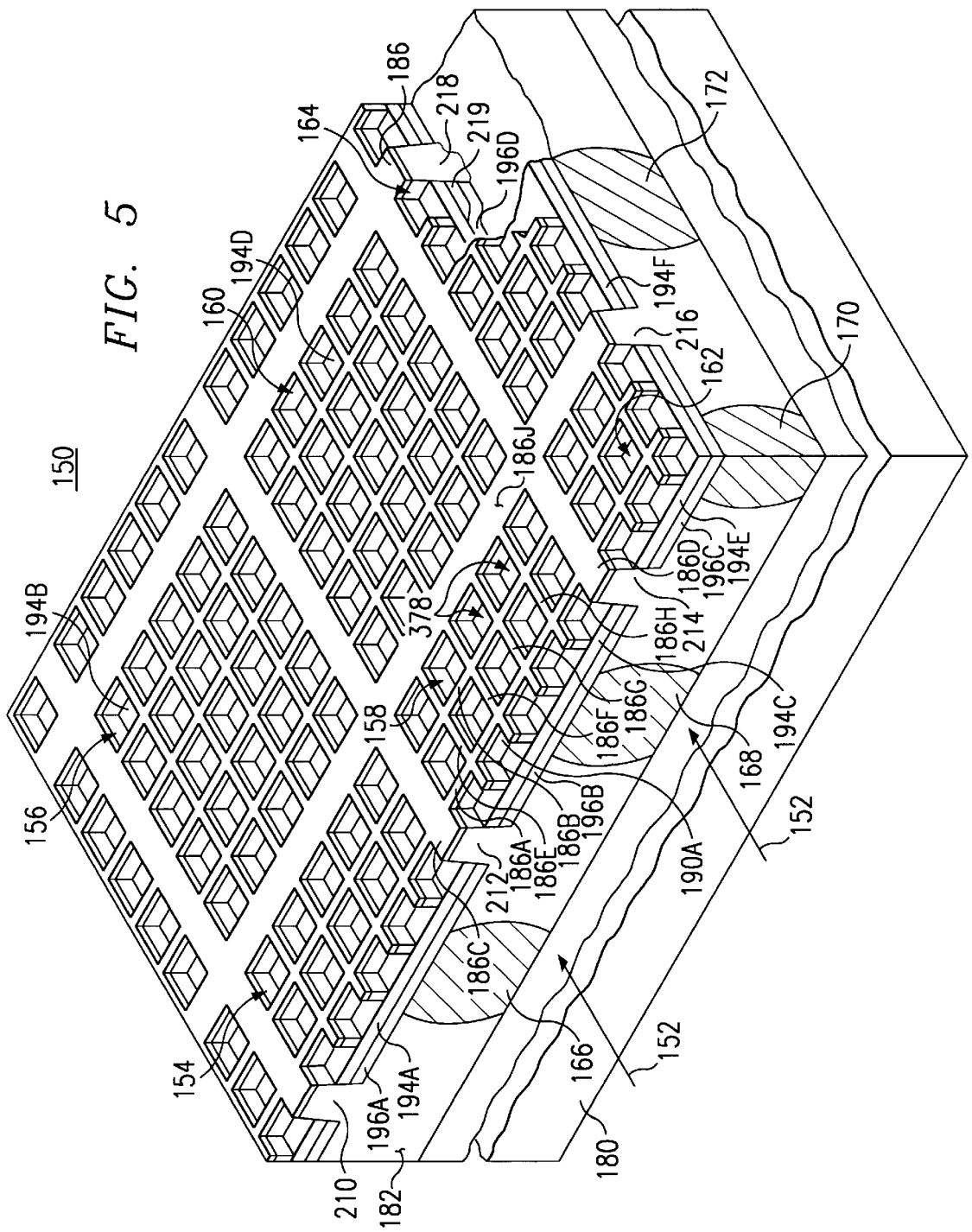
FIG. 5 is a perspective, partially sectioned, view of a multi-pixel, focal plane array with unpolarized two dimensional grating EQWIP elements hybridized to a silicon readout integrated circuit (ROIC)

Referring now to FIG. 5, there is shown a focal plane detector array 150 which includes a plurality of detectors as described above arranged in an array. A view of the detector array 150 as indicated by the arrows 152 corresponds substantially to the views shown in FIGS. 3D and 4A. The detector array 150 includes detector pixel structures 154, 156, 158, 160, 162 and 164. Each pixel structure 154–164 has a corresponding In bump such as bump 166 for pixel structure 154, bump 168 for pixel structure 158, bump 170 for pixel structure 162 and bump 172 for pixel structure 164. Each of the bumps is connected to a corresponding terminal (not shown) of a ROIC 180. A wicked epoxy 182 bonds the pixel structures 154–164 to the ROIC 180.

The pixel structure 158 is described in detail. The remaining pixel structures have a similar configuration. The entire top surface of the detector array 150 comprises an upper array n$^+$GaAs contact 186 which has been etched to have elongate (strip) segments including 186A and 186B which extend between wider elongate n$^+$GaAs conductors 186C and 186D. Elongate segments in pixel structure 158 include segments 186E, 186F, 186G and 186H. The segments 186E–186H are each connected at a common end to a wide n$^+$GaAs conductor 186J and a similar conductor (not shown) at the opposite side of the pixel structure 158. The contact segments 186A and 186B are transverse to the contact segments 186E, 186F, 186G and 186H. Contact segments 186E–186H correspond to contacts 66A, 66B, 66C and 66D in FIG. 3D. The n$^+$GaAs conductors 186C and 186D correspond to conductors 66E and 66F in FIG. 3D.

Each of the pixel structures 154–164 has a contact/reflector for electrically connecting the lower contact of the pixel to the corresponding In bump. likewise provide space for the application of the optical cavity enhancement coating. The element 122, as an example for all of the elements in detector 120, includes an elongate n$^+$GaAs contact 122A which is in physical and electrical contact with the upper surface of the elongate MQW element 122B and a lower elongate n$^+$GaAs portion of the contact 112. The patterned contact 112 is positioned on the surface of a metal reflector 132, which is essentially the same as the reflector 114 shown in FIG. 4A. A planar ohmic contact 134, corresponding to the ohmic contact 113 shown in FIG. 4A, is formed on the n$^+$GaAs contact 112 at a position to the lower right of the element 130. The contact/reflector 132 is then formed. The ohmic contact 134 provides a good ohmic connection between the contact 112 and the reflector 132.

A further embodiment of a detector 120 is shown in FIG. 4C. This is the same as the detector 100 shown in FIG. 4A but the etching operation which formed the elements 102–110 is continued until the etching extends through the lower contact 112 except for one region. A region 112A is not removed. This etching produces elements 138, 139, 140, 141 and 142. The width and spacing of these elements is approximately the same as the width and spacing of the elements 102–110 shown in FIG. 4A. Like FIG. 4A, FIG. 4C shows voids or air spaces created between the elements. These air spaces will accommodate the applied optical cavity enhancement coating. The sensitivity of a detector to a given wavelength of infrared radiation is related to the width and spacing of the MQW elements. The element 138, as an example of all of the elements, includes an elongate upper n$^+$GaAs contact 138A in physical and electrical contact with the upper surface of an elongate MQW element 138B and a lower elongate n$^+$GaAs contact 138C is connected to the lower surface of the MQW element 138B. The contact 138C and the corresponding contacts on the other elements, are positioned on the surface of a metal contact/reflector 137, which is essentially the same as the reflector 114 shown in FIG. 4A. A planar ohmic contact 143, corresponding to the ohmic contact 113 shown in FIG. 4A, is formed on the n$^+$GaAs contact 112 at the position of the region 112A. The The region between the bumps is filled with wicked epoxy 182, such as shown in FIGS. 3C and 3D.

In each of the pixel structures 154–164 immediately below the n$^+$GaAs contact 186 is a diffractive MQW structure 190 which has a segment beneath each of the contact 186 segments. This is essentially the same as shown in FIGS. 3D and 4A. For example, MQW element 190A is immediately below contact 186A.

A planar contact is formed in a position between the MQW structure 190 and a contact/reflector. The pixel structures 154, 156, 158, 160, 162 and 164 have respective lower (second) contacts 194A, 194B, 194C, 194D, 194E and 194F.

A contact/reflector 196A is in a lower portion of pixel structure 154. Reflector 196A is physically and electrically in contact with bump 166. A contact/reflector 196B is in the lower portion of pixel structure 158 and is in electrical contact with the bump 168. A contact/reflector 196C is in the lower portion of pixel structure 162 and a contact/reflector 196D is in the lower portion of pixel structure 164. The contacts/reflectors are made preferably of Au and have a preferred thickness of 2,000 Å. Reflectors 196A–196D correspond to reflector 72 in FIG. 3D.

Slots 210, 212, 214, 216 and 218 are etched into the structure of detector 150 to electrically isolate each pixel structure. Each of these slots extends upward from the region occupied by the bumps up to the lower surface of the contact 186. These slots are filled with the epoxy 182, which is electrically nonconductive. The result of the fabrication is a series of square channels formed by the EQWIP elements and the slots, giving the detector an eggcrate appearance.

Each of the pixel structures 154, 156, 158, 160, 162 and 164 has 25 sections (5 by 5) and has generally at the base of one section a rectangular, planar ohmic contact, such as ohmic contact 219 shown for pixel structure 164. The ohmic contact can extend to have an area greater than that of one section. The ohmic contact 219 is made of Au/Ge and is positioned between the lower n$^+$GaAs contact 194F and the Au reflector 196D. The ohmic contact 219 provides an ohmic connection between the n$^+$GaAs contact 194F and the reflector 196D. A similar ohmic contact is provided at a similar location in each of the other pixel structures.

Each of the contacts/reflectors provides an electrical connection to the corresponding bump beneath the detector pixel structure. Each contact/reflector also functions as an infrared radiation reflector.

The detector array 150 is fabricated by use of the materials and steps described in reference to FIGS. 3A–3D. Parameters for the detector array 150, as shown in FIG. 5, are set out in Table I below. The test results shown in Table II is for a detector in which the pixel size is 56 $\mu$m×56 $\mu$m and a typical pixel spacing in the array is 60 $\mu$m×60 $\mu$m.

The top contact 186 is connected to through-conductors on the periphery outside the pixel structures. These through-conductors extend down to In bumps, as described above, to terminals of the underlying ROIC.

Optimum parameters for a detector as shown in FIG. 5 are set out in Table I below.

TABLE I

| PARAMETER | UNITS | OPTIMAL VALUE |
|---|---|---|
| PEAK SPECTRAL RESPONSE | $\mu$m | 9.0 |
| SPECTRAL FULL WIDTH AT HALF MAX | $\mu$m | ~1.2 |
| GaAs WELL PARAMETERS | | |
| THICKNESS | A | 45 |
| DOPING (n-TYPE) | cm$^{-3}$ | 1 × 10$^{18}$ |
| NUMBER OF WELLS | | 18 |
| Al$_x$Ga$_{1-x}$As BARRIER PARAMETERS | | |
| x-VALUE | | ~0.27 |
| THICKNESS | A | 500 |
| NUMBER OF BARRIERS | | 19 |
| STRUCTURAL PARAMETERS | | |
| TOP (PATTERNED) CONTACT THICKNESS (n-doping N$_D$ = 2 × 10$^{18}$cm$^{-3}$) | $\mu$m | 0.4 |
| MQW THICKNESS | $\mu$m | 1.03 |
| BOTTOM (UNPATTERNED) CONTACT THICKNESS (n-doping N$_D$ = 2 × 10$^{18}$cm$^{-3}$) | $\mu$m | 0.4 |
| 2-D MQW GRATING PERIOD | $\mu$m | 8 |
| MQW GRATING STRIP WIDTH | $\mu$m | 1.2 |

Test results for a detector fabricated as shown in FIG. 5 are shown in Table II below.

TABLE II

| PARAMETER | TEMP (K) | BIAS (V) | ARRAY AVERAGE (58 SAMPLES) | STANDARD DEVIATION (%) |
|---|---|---|---|---|
| PEAK SPECTRAL RESPONSE ($\mu$m) | 77.3 | 0.5 | 8.4 | |
| SPECTRAL FWHM ($\mu$m) | | | 1.0 | |
| D*(500K) (cmHz$^{1/2}$/W) FOV = 23° | 77.3 | 0.5 | 3.95 × 10$^9$ | 4.7 |
| | | 1.5 | 4.67 × 10$^9$ | 4.1 |
| | 83 | 0.5 | 2.07 × 10$^9$ | 3.1 |
| | | 1.5 | 2.32 × 10$^9$ | 4.5 |
| DARK CURRENT DENSITY (A/cm$^2$) | 77.3 | 0.5 | 5.5 × 10$^{-5}$ | 3.4 |
| | | 1.5 | 1.6 × 10$^{-4}$ | 3.8 |
| | 83 | 0.5 | 1.6 × 10$^{-4}$ | 4.4 |
| | | 1.5 | 5.9 × 10$^{-4}$ | 3.6 |

The detector array 150 shown in FIG. 5 is non-polarized because the MQW diffractive grating elements are transverse to each other within each pixel structure. Therefore, all polarizations of incident infrared radiation are received.

Figure 6:
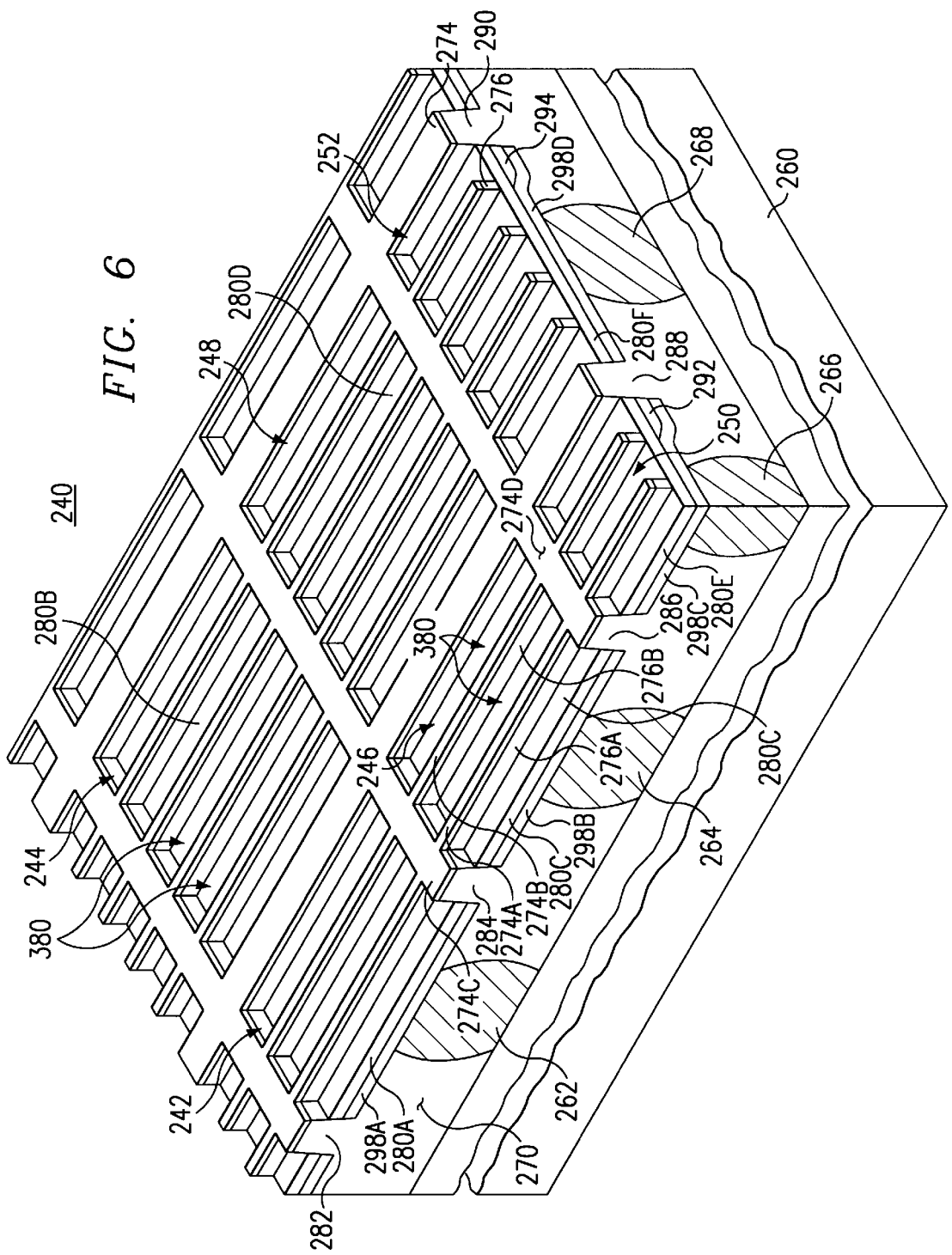
FIG. 6 is a perspective, partially sectioned view of a further embodiment of the present invention, similar to that shown in FIG. 5, but having polarized one-dimension grating EQWIP elements.

Referring to FIG. 6, there is shown a polarized detector array 240 which is similar to the detector array 150 shown in FIG. 5, but has elongate diffractive MQW elements extending in only one direction. The detector array 240 includes detector pixel structures 242, 244, 246, 248, 250 and 252. Each pixel structure has a corresponding In bump for connection to an ROIC 260. Bump 262 connects pixel structure 242 to a terminal (not shown) of ROIC 260. In a similar fashion, there is provided a bump 264 for pixel structure 246, a bump 266 for pixel structure 250 and a bump 268 for pixel structure 252. There is a corresponding bump for each of the pixels within the detector array 240. Each pixel structure therefore generates a different signal which is provided to the ROIC 260.

The space between the bumps 262–268 is filled with wicked epoxy 270 for bonding the surrounding elements together.

The detector array 240 has a layer comprising an n$^+$GaAs array contact 274 on the upper surface thereof which comprises a plurality of elongate contact strips, all of which are electrically and physically interconnected to each other. The pixel structure 246 has elongate contacts 274A and 274B.

Below the contact 274, there is a diffractive MQW structure 276 similar to the structure 190 shown in FIG. 5 and the structure 68 shown in FIG. 3D. The pixel structure 246 includes MQW elements 276A and 276B, which have the n$^+$GaAs strip contacts 274A and 274B on the upper surfaces thereof. The contact strips 274A and 274B extend between wider n$^+$GaAs conductors 274C and 274D.

A lower (second) planar n$^+$GaAs contact for each pixel structure extends across the detector 240 but is divided into separate contacts for each of the pixel structures. This consists of contact 280A for structure 242, contact 280B for structure 244, contact 280C for structure 246, contact 280D for structure 248, contact 280E for structure 250 and contact 280F for structure 252. Contact 280 corresponds to the contact 70 shown in FIGS. 3A–3D. The contacts 280A–F are separated by slots 282, 284, 286, 288 and 290. The resulting structure has elongate channels 380 formed by the EQWIP elements and the slots.

An Au contact/reflector is also divided by the slots 282–290 in individual contact/reflectors corresponding to each pixel structure. Pixel structure 242 has reflector 298A, structure 246 has reflector 298B, structure 250 has reflector 298C and pixel structure 252 has reflector 298D. As described for detector array 150 in FIG. 5, each of the reflectors provides an electrical connection to the corresponding bump beneath the pixel structure. Each reflector also functions as an infrared radiation reflector.

Each of the pixel structures 242, 244, 246, 248, 250 and 252 has five longitudinal sections and one longitudinal section thereof is provided with an ohmic contact, such as ohmic contact 292 shown for pixel structure 250 and contact 294 shown for pixel structure 252. Each ohmic contact is a rectangular structure comprising Au/Ge having a thickness of 900 Å. Each ohmic contact is formed between the corresponding lower contact, such as contact 280E for pixel structure 250 and the underlying reflector 298C. The ohmic contact provides a good ohmic connection between the overlying second n$^+$GaAs contact and the underlying Au reflector.

The detector array 240 shown in FIG. 6 has elongate MQW elements running in only one direction. It is therefore sensitive to only one polarity of infrared radiation.

Figure 7:
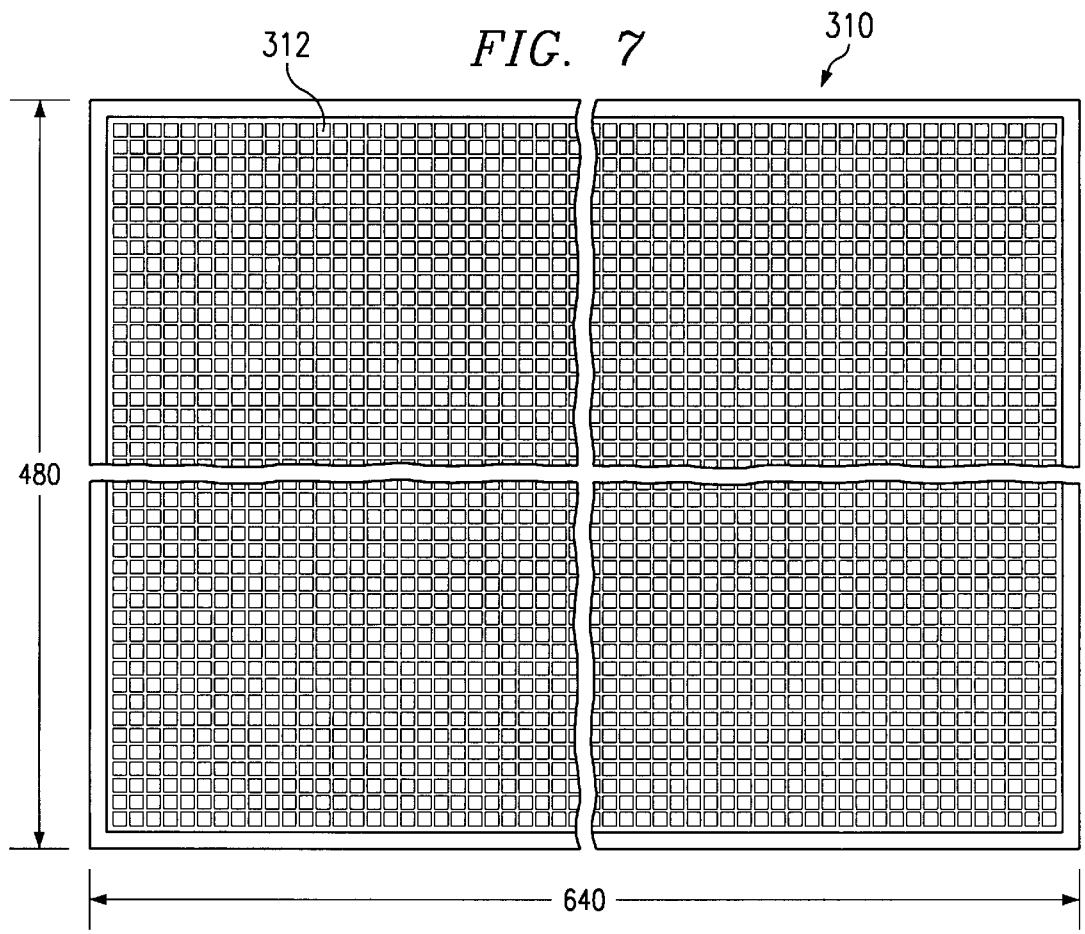
FIG. 7 is a planar view of a focal plane array utilizing a large number of detector pixel structures.

Referring to FIG. 7, there is shown a focal plane array 310 which comprises a plurality of pixel structures. This array preferably has 640 pixel structures horizontally and 480 pixel structures vertically. One pixel structure 312, as an example, corresponds to pixel structure 158 described in reference to FIG. 5. Each of the pixel structures within the array 310 has a separate electrical output signal so that a complete image having 640×480 elements can be produced.

Figure 8:
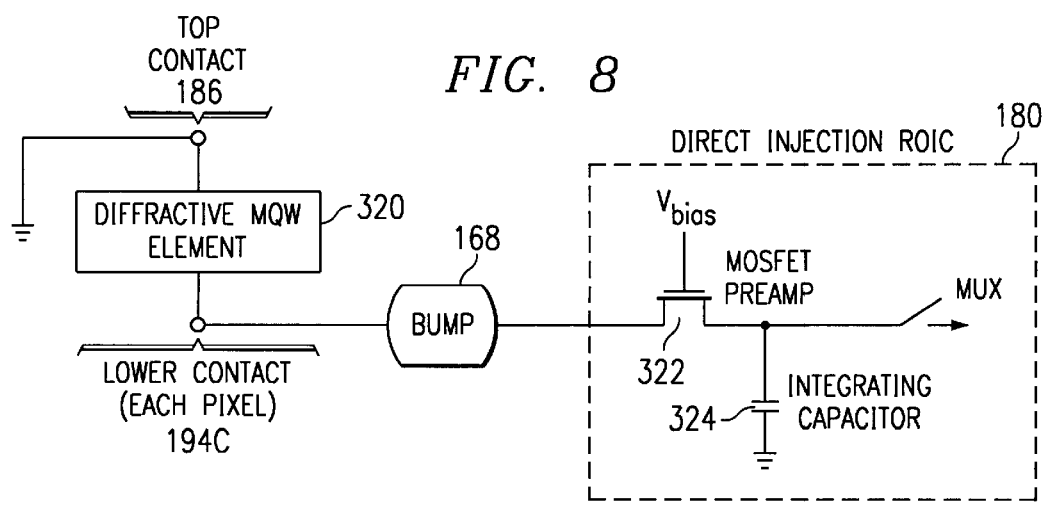
FIG. 8 is a block and schematic illustration of an electrical circuit for each EQWIP pixel structure.

Referring to the detector array 150 as shown in FIG. 5, a top n+GaAs contact, such as contact 186, is connected to an electrically common point which is shown by a ground symbol in FIG. 8. A particular diffractive MQW element 320 which corresponds, for example, to the diffractive MQW element 190A, is connected between the top contact 186 and the lower contact, which corresponds to n+GaAs contact 194C. The lower contact is ohmically connected to the Au reflector 196B and connected through the bump 168 to the ROIC 180. For a preferred embodiment this is a "direct injection" ROIC.

The signal transmitted through the bump 168 is provided to a MOSFET PREAMP transistor 322 which has a gate terminal connected to a $V_{bias}$ supply. Transistor 322 functions as a preamplifier. The amplified signal produced by transistor 322 is integrated by a capacitor 324. The integrated signal is provided to a multiplexer (not shown) which selectively samples the signal produced by each of the pixel structures throughout the array. The MQW element 320 is provided with the noted bias voltage through the transistor 322 and intervening conductors to the MQW element 320.

When infrared radiation is absorbed by the diffractive MQW element 320, carriers are produced which change the conductivity of the MQW element. This changes the output signal from the element. This change in signal corresponds to the received infrared radiation. The collection of all of the signals from the pixel elements produces an image representative of the received infrared radiation.

Although each of the MQW elements described above has a linear configuration, such elements may also have a curved or elongate configuration.

Figure 9A:
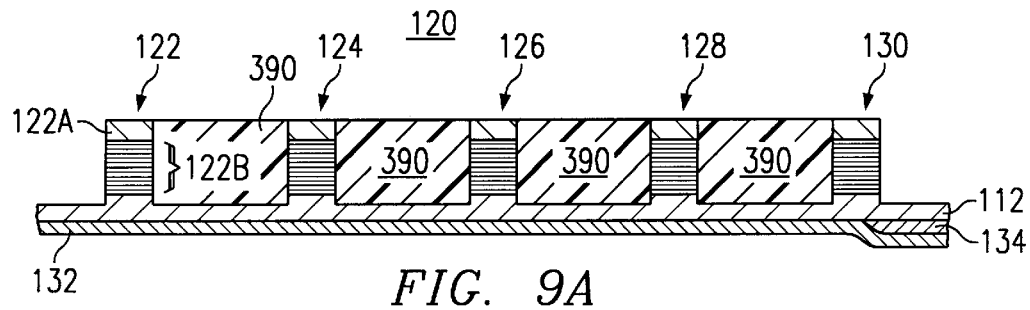
FIG. 9A is a view of one embodiment of the EQWIP structure with the optical cavity enhancement coating.
Figure 9B:
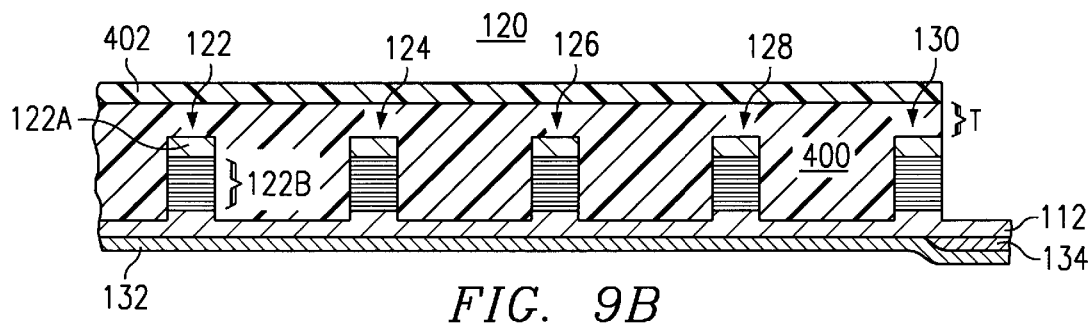
FIG. 9B is a view of another embodiment of the EQWIP structure with the optical cavity enhancement coating.

The EQWIP structure provides enhanced performance for receiving infrared radiation without an optical cavity enhancement coating. The upper and lower contact connections on opposite longitudinal surfaces provides current flow transverse to the axis to the elongate, diffractive MQW elements. The elongate, diffractive MQW elements produce less dark current in proportion to the MQW cross-sectional area than a conventional QWIP in which the MQW is unpatterned. It has been discovered that the spacing between the elements exposes the elements to air and permits leakage current. This surface leakage current along the surface creates additional noise which degrades performance. By applying an optical cavity enhancement coating the surface current is reduced and therefore noise in the detection signal can be reduced, enhancing performance. As shown in FIG. 9A the optical cavity enhancement coating is applied in the preferred embodiment so as to fill the space between the elements. For ease of illustration, FIG. 9A corresponds to FIG. 4B, but in addition shows an optical cavity enhancement coating 390 applied in the space between the elements 122, 124, 126, 128 and 130 so as to cover the longitudinal surfaces of the elements. Filling the air space (voids) between the elements is beneficial if the proper material is utilized. When the space is completely filled, the optical cavity enhancement coating should be of a material with a refractive index of 1.5 or less. The index of refraction of the optical cavity enhancement coating is important because if it is too high, the electromagnetic energy field will be concentrated in both the absorbing quantum well portion of the EQWIP material as well as in the coating located between the voids. Since the detector utilizes only the energy collected in the absorbing quantum well portion of the EQWIP material, energy concentration in the optical cavity enhancement coating should be minimized. FIG. 9B shows the resulting structure of the preferred embodiment in which the entire space between the elements 122, 124, 126, 128 and 130 is filled with optical cavity enhancement coating 400 and the coating extends above the n+ contacts 122A. It is desirable that the thickness T above the contacts be in the range of 1 to 3 microns. FIG. 9B also corresponds to FIG. 4B but illustrates a different configuration of the optical cavity enhancement coating which also forms an overcoat over the entire array structure. If desired, an anti-reflective coating 402 can be applied to the planar surface of the optical cavity enhancement coating 400. Anti-reflective coatings are known in art and will not be described further. The optical cavity enhancement coating can be applied in a similar fashion to the embodiments illustrated in FIGS. 4A and 4C.

Figure 10:
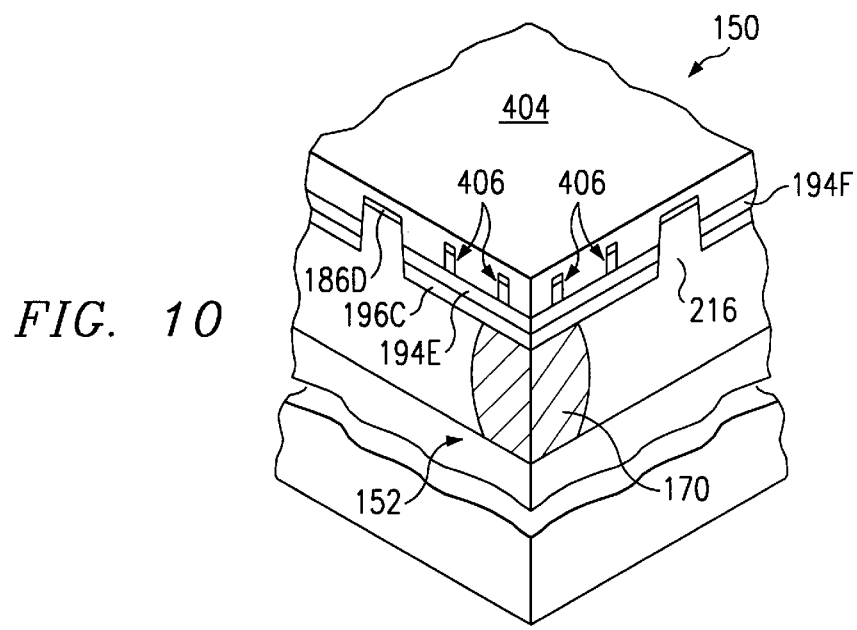
FIG. 10 is a perspective, partially sectioned, view of an array with an optical cavity enhancement coating.

FIG. 10 is a partial view of the focal plane detector array 150 including an overcoat of optical cavity enhancement material 404. The view of the array is indicated by arrow 152 and corresponds to views shown in FIGS. 3D and 4A, with the exception of the addition of the optical cavity enhancement coating. As can be seen, the optical cavity enhancement coating in the illustrated embodiment shows an overcoat that extends above the elements composed of the various elongate MQW element and the n+ contacts, generally indicated as 406. In the preferred embodiment, the outer surface of the optical cavity enhancement coating is smooth and follows the shape of the outer edges of the array. For ease of illustration, a planar array is shown and thus the overcoat would preferably have a flat top surface.

The optical cavity enhancement overcoat may be a suitable plastic such as polyimide which is spun onto the device during fabrication. The polyimide may be applied by spinning the polyimide onto the detector. In this method, the polyimide is applied to the detector as a liquid, while the detector is on the spinner. The spinner is rotated throwing off the excess polyimide. The thickness of the polyimide remaining can be controlled by variations in the viscosity of the liquid and by the rotational speed of the spinner. Thereafter, the polyimide is cured. Curing is usually accomplished by heating the polyimide to a suitable temperature. The curing temperature will vary depending on the particular polyimide.

In the event the optical cavity enhancement coating does not completely fill the void, the coating material can have a refractive index of 2.5 or less and preferably 2.0 or less. The proper selection of the refractive index of the coating will result in the concentration of energy in the quantum well portion of the EQWIP material, although some energy will be in the coating. Concentrating the majority of the energy in the EQWIP material increases the response signal due to the incident energy. The optical cavity enhancement can also be a dielectric having a refractive index as specified such as $SiO_2$ or $Si_3N_4$. The $SiO_2$ or $Si_3N_4$ may be applied by any suitable technique known in the art such as evaporation.

Figure 11:
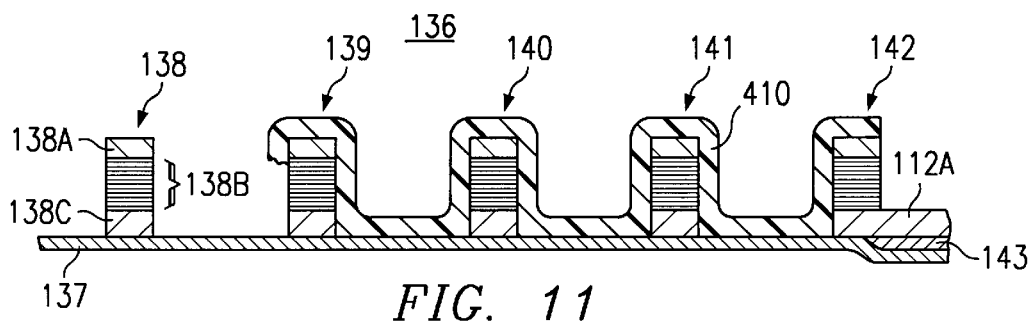
FIG. 11 is a side view of another embodiment of the EQWIP structure with an optical enhancement coating which conforms to the shape of the detector.

In another embodiment of the present invention illustrated in FIG. 11, the optical cavity enhancement coating does not completely fill the space or void between the elements. As is shown in FIG. 11, the coating 410 may be a conforming covering which mirrors the shape of the array without the coating. As can be seen in FIG. 11, the surfaces of elements 140, 141, 142 are covered with the optical cavity enhancement coating. For purposes of illustration, the coating is shown extending only to element 139. FIG. 11 corresponds to FIG. 4c . However, the same technique may be used to provide an optical cavity enhancement coating to the embodiments illustrated in FIGS. 4a and 4b. Thus, the coating will cover the longitudinal surfaces of the elements as well as the reflector or lower contact as the case may be. (See FIGS. 4A, 4B, 4C, showing embodiment where the lower contact covers the reflector and an embodiment where the reflector is exposed). When the optical cavity enhancement coating does not fill the entire space between the elements an enhancement coating material having a higher refractive index may be utilized. In such instances, the refractive index can be 2.5 or less and preferably is 2.0 or less. The thickness of the conformable coating which does not fill the void is selected in conjunction with the refractive index of the coating material and the wavelength the detector is designed to detect. The refractive index and the thickness of the coating can be adjusted so as to achieve maximum resonance for the wavelength the detector is designed to detect. The optical cavity enhancement coating can be any non-conductive material having a suitable index of refraction and which is compatible, i.e., does not degradate the materials used to construct the detector. The indices of refraction in the 8–12 micron wavelength region for suitable coatings are:

| | |
|---|---|
| Polyimide | 1.5 |
| SiO$_2$ | about 1.45 (but varying) |
| Si$_3$N$_4$ | 2.0 |
| ZnS | 2.2 |

While the above description includes only a single component optical cavity enhancement coating, multiple layers may also be used. A multi-component, stacked or laminated coating can further enhance optical and electrical properties of the detector element. Drawings 9A, 9B, 10 and 11 are not to scale for purposes of illustration.

The present invention has been described using a Gallium Arsenide/Aluminum Gallium Arsenide MQW operating in the long wave infrared spectral band of 8–10 μm. However, through the proper selection of parameters and of MQW material systems, the invention is applicable to others spectral bands. Alternate MQW material systems include but are not limited to Indium Gallium Arsenide/Indium Aluminum Arsenide, Indium Gallium Arsenide/Indium Phosphide and strained Indium Gallium Arsenide/Gallium Arsenide.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention.

What I claim is:

1. A quantum well infrared radiation photodetector, comprising:

a plurality of elongate, multiple quantum well infrared radiation absorbing elements, each of said elements having first and second opposite longitudinal surfaces, said multiple quantum well elements comprising a diffraction grating for said infrared radiation, a first contact which includes a plurality of planar electrically interconnected strips respectively in contact with and extending along said first surfaces of said multiple quantum well elements, a second contact electrically connected to said second surfaces of said multiple quantum well elements, said first contact and said second contact positioned on opposite longitudinal sides of each of said multiple quantum well elements to provide current flow through said elements in a direction substantially transverse to an axis of said elements, a planar reflector for said infrared radiation, said reflector positioned on an opposite side of said second contact from said multiple quantum well elements; and an optical cavity enhancement coating having a refractive index of 2.5 or less applied to the longitudinal surfaces, wherein a thickness of said optical cavity enhancement coating is selected such that said infrared radiation is concentrated in said multiple quantum well elements forming said diffraction grating.

2. A quantum well infrared radiation photodetector as recited in claim 1 wherein said first contact strips are coplanar and said second contact has a planar configuration.

3. A quantum well infrared radiation photodetector as recited in claim 2 wherein said optical cavity enhancement coating has an index of refraction of 1.5 or less and extends from said second contact, along said surfaces completely filling a space between the surfaces.

4. A quantum well infrared radiation photodetector as recited in claim 1 wherein said second contact has a planar component extending across said photodetector and a plurality of integral elongate components respectively for each of said multiple quantum well elements.

5. A quantum well infrared radiation photodetector as recited in claim 1 wherein said second contact includes a plurality of electrically interconnected strips respectively in contact with and extending along said second surfaces of said multiple quantum well elements.

6. A quantum well infrared radiation photodetector as recited in claim 1 wherein said multiple quantum well infrared radiation absorbing elements are parallel to each other.

7. A quantum well infrared radiation photodetector as recited in claim 1 wherein said multiple quantum well infrared radiation absorbing elements are periodically spaced.

8. A quantum well infrared radiation photodetector as recited in claim 1 wherein each of said multiple quantum well elements has a linear configuration.

9. A focal plane array for detecting infrared radiation, the array including a plurality of detector pixel structures, the focal plane array comprising:

an array contact which includes a plurality of first contact strips and a plurality of second contact strips wherein said contact strips are electrically interconnected and said first contact strips are angularly offset from said second contact strips, said array contact encompassing all of said detector pixel structures, a plurality of first elongate, multiple quantum well infrared radiation absorbing elements in each of said detector pixel structures, each of said first multiple quantum well elements having first and second opposite longitudinal surfaces, a plurality of second elongate, multiple quantum well infrared radiation absorbing elements in each of said detector pixel structures, each of said second multiple quantum well elements having first and second opposite longitudinal surfaces, said first multiple quantum well elements and said second quantum multiple well elements comprising a diffraction grating for said infrared radiation, a second contact for each of said detector pixel structures, said second contact electrically connected to said second surfaces of said first and second multiple quantum well elements in the corresponding one of said detector pixel structures, each said first and second multiple quantum well elements having said array contact and said second contact positioned on opposite longitudinal sides thereof to provide current flow through said first and second multiple quantum well elements in a direction substantially transverse to an axis of the element;

a planar infrared radiation reflector for each said detector pixel structure, said reflector positioned on an opposite side of said second contact from said first and second multiple quantum well elements; and an optical cavity enhancement coating having a refractive index of 2.5 or less applied to the longitudinal surfaces of said plurality of first and second elongate elements, wherein a thickness of said optical cavity enhancement coating is selected such that said infrared radiation is concentrated in said multiple quantum well elements forming said diffraction grating.

10. A focal plane array as recited in claim 9 wherein said first and second contact strips of said array contact are coplanar.

11. A focal plane array as recited in claim 9 wherein said second contact has a planar configuration.

12. A focal plane array as recited in claim 9 wherein said second contact includes a plurality of electrically interconnected strips respectively in contact with and extending along said second surfaces of said first and second multiple quantum well elements.

13. A focal plane array as recited in claim 9 wherein said planar reflector is electrically conductive and including an ohmic contact which is ohmically connected to said second contact and ohmically connected to said planar reflector.

14. A focal plane array as recited in claim 9 wherein said second contact has a planar component extending across said pixel structure and a plurality of integral elongate components respectively for each of said first and second multiple quantum well elements.

15. A focal plane array as recited in claim 9 wherein said first contact strips are parallel to each other and said second contact strips are parallel to each other and wherein said coating has a refractive index of 1.5 or less and extends from the said second contact strips along said longitudinal surfaces so as to completely fill a space between said first and second multiple quantum well elements.

16. A focal plane array as recited in claim 9 wherein said first multiple quantum well elements are parallel to each other and said second multiple quantum well elements are parallel to each other.

17. A focal plane array as recited in claim 9 wherein said first and second multiple quantum well elements are periodically spaced.

18. A focal plane array as recited in claim 9 wherein each of said first and second multiple quantum well elements has a linear configuration.

19. A focal plane array as recited in claim 9 wherein said first multiple quantum well elements are transverse to said second multiple quantum well elements.

20. A focal plane array for detecting infrared radiation, the array including a plurality of detector pixel structures, the focal plane array comprising:

an array contact which includes a plurality of contact strips wherein said contact strips are electrically interconnected, said array contact encompassing all of said detector pixel structures, a plurality of elongate, multiple quantum well infrared radiation absorbing elements in each of said detector pixel structures, each of said multiple quantum well elements having first and second opposite longitudinal surfaces, said multiple quantum well elements comprising a diffraction grating for said infrared radiation, a second contact for each of said detector pixel structures, said second contact electrically connected to said second surfaces of said multiple quantum well elements in the corresponding one of said detector pixel structures, each said multiple quantum well element having said array contact and said second contact positioned on opposite longitudinal sides thereof to provide current flow through the said multiple quantum well element in a direction substantially transverse to an axis of the element;

a planar infrared radiation reflector for each said detector pixel structure, said reflector positioned on an opposite side of said second contact from said multiple quantum well elements; and an optical cavity enhancement coating having a refractive index of 2.5 or less applied to the longitudinal surfaces, wherein a thickness of said optical cavity enhancement coating is selected such that said infrared radiation is concentrated in said multiple quantum well elements forming said diffraction grating.

21. A focal plane array as recited in claim 20 wherein said contact strips of said array contact are coplanar.

22. A focal plane array as recited in claim 20 wherein said second contact has a planar configuration.

23. A focal plane array as recited in claim 20 wherein said second contact includes a plurality of electrically interconnected strips respectively in contact with and extending along said second surfaces of said multiple quantum well elements.

24. A focal plane array as recited in claim 20 wherein said planar reflector is electrically conductive and including an ohmic contact which is ohmically connected to said second contact and ohmically connected to said planar reflector.

25. A focal plane array as recited in claim 20 wherein said second contact has a planar component extending across said pixel structure and a plurality of integral elongate components respectively for each of said multiple quantum well elements.

26. A focal plane array as recited in claim 20 wherein said coating has a refractive index of 1.5 or less and extends from the said reflector along said surfaces of said elements so as to completely cover a space between the surfaces from the reflector to said first contacts.

27. A focal plane array as recited in claim 20 wherein said coating extends above said first contacts to provide a planar surface over a top of the array.

28. A focal plane array as recited in claim 20 wherein each of said multiple quantum well elements has a linear configuration.

29. A quantum well infrared radiation photodetector as recited in claim 1 wherein the optical cavity enhancement coating is applied in layers.

30. A focal plane array as recited in claim 9 wherein the optical cavity enhancement coating is applied in layers.

31. A focal plane array as recited in claim 20 wherein the optical cavity enhancement coating is applied in layers.

32. A quantum well infrared radiation photodetector as recited in claim 1 wherein said optical cavity enhancement coating is selected from the group consisting of $SiO_2$, $Si_3N_4$, ZnS, and polyimides.

33. A focal plane array as recited in claim 9 wherein said optical cavity enhancement coating is selected from the group consisting of $SiO_2$, $Si_3N_4$, ZnS, and polyimides.

34. A focal plane array as recited in claim 20 wherein said optical cavity enhancement coating is selected from the group consisting of $SiO_2$, $Si_3N_4$, ZnS, and polyimides.

35. A quantum well infrared radiation photodetector as recited in claim 3 wherein said optical cavity enhancement coating extends above and covers said first contact strips.

36. A focal plane array as recited in claim 15 wherein said optical cavity enhancement coating extends above and covers said first contact strips.

37. A focal plane array as recited in claim 26 wherein said optical cavity enhancement coating extends above and covers said first contact strips.

38. A quantum well infrared radiation photodetector as recited in claim 3 further comprising an anti-reflective coating applied to the optical cavity enhancement coating.

39. A focal plane array as recited in claim 15 further comprising an anti-reflective coating applied to the optical cavity enhancement coating.

40. A focal plane array as recited in claim 26 further comprising an anti-reflective coating applied to the optical cavity enhancement coating.

41. A quantum well infrared radiation photodetector, comprising:

a plurality of elongate, multiple quantum well infrared radiation absorbing elements, each of said elements having first and second opposite longitudinal surfaces, said multiple quantum well elements comprising a diffraction grating for said infrared radiation, a first contact which includes a plurality of planar electrically interconnected strips respectively in contact with and extending along said first surfaces of said multiple quantum well elements, a second contact electrically connected to said second surfaces of said multiple quantum well elements, said first contact and said second contact positioned on opposite longitudinal sides of each of said multiple quantum well elements to provide current flow through said elements in a direction substantially transverse to an axis of said elements, a planar reflector for said infrared radiation, said reflector positioned on an opposite side of said second contact from said multiple quantum well elements; and an optical cavity enhancement coating having a refractive index of 2.5 or less applied to the longitudinal surfaces, wherein said optical cavity enhancement coating has an index of refraction of 1.5 or less and extends from said second contact, along said surfaces completely filling a space between the surfaces.

\* \* \* \* \*